US011557668B2

(12) United States Patent
Nakata

(10) Patent No.: US 11,557,668 B2
(45) Date of Patent: Jan. 17, 2023

(54) HIGH ELECTRON MOBILITY TRANSISTOR WITH REVERSE ARRANGEMENT OF CHANNEL LAYER AND BARRIER LAYER

(71) Applicant: SUMITOMO ELECTRIC DEVICE INNOVATIONS, INC., Kanagawa (JP)

(72) Inventor: Ken Nakata, Yokohama (JP)

(73) Assignee: SUMITOMO ELECTRIC DEVICE INNOVATIONS, INC., Kanagawa (JP)

(*) Notice: Subject to any disclaimer, the term of this patent is extended or adjusted under 35 U.S.C. 154(b) by 207 days.

(21) Appl. No.: 17/129,621

(22) Filed: Dec. 21, 2020

(65) Prior Publication Data

US 2021/0111278 A1  Apr. 15, 2021

Related U.S. Application Data

(63) Continuation of application No. 16/993,935, filed on Aug. 14, 2020, now Pat. No. 10,971,614, and a continuation of application No. 16/393,689, filed on Apr. 24, 2019, now Pat. No. 10,790,385.

(30) Foreign Application Priority Data

Apr. 25, 2018 (JP) .............................. JP2018-084397
Apr. 25, 2018 (JP) .............................. JP2018-084398

(51) Int. Cl.
*H01L 29/778* (2006.01)
*H01L 29/10* (2006.01)
*H01L 29/205* (2006.01)
*H01L 29/20* (2006.01)

(52) U.S. Cl.
CPC ...... *H01L 29/7786* (2013.01); *H01L 29/1029* (2013.01); *H01L 29/2003* (2013.01); *H01L 29/205* (2013.01)

(58) Field of Classification Search
CPC ............. H01L 29/7786; H01L 29/1029; H01L 29/2003; H01L 29/205
USPC ........................................................ 257/194
See application file for complete search history.

(56) References Cited

U.S. PATENT DOCUMENTS

| 2013/0026489 | A1 | 1/2013 | Gambin et al. | |
| 2016/0343842 | A1* | 11/2016 | Matsuda | H01L 29/7783 |
| 2019/0027577 | A1* | 1/2019 | Makabe | H01L 29/66462 |
| 2019/0081154 | A1* | 3/2019 | Watanabe | H01L 21/28587 |

FOREIGN PATENT DOCUMENTS

| JP | 2008-539586 | 11/2008 |
| JP | 2012-74705 | 4/2012 |
| JP | 2014-524661 | 9/2014 |

(Continued)

*Primary Examiner* — Jami Valentine Miller
(74) *Attorney, Agent, or Firm* — Smith, Gambrell & Russell, LLP

(57) ABSTRACT

A high electron mobility transistor (HEMT) made of primarily nitride semiconductor materials is disclosed. The HEMT, which is a type of reverse HEMT, includes, on a C-polar surface of a SiC substrate, a barrier layer and a channel layer each having N-polar surfaces in respective top surfaces thereof. The HEMT further includes an intermediate layer highly doped with impurities and a Schottky barrier layer on the channel layer. The Schottky barrier layer and a portion of the intermediate layer are removed in portions beneath non-rectifying electrodes but a gate electrode is provided on the Schottky barrier layer.

16 Claims, 6 Drawing Sheets

(56) References Cited

FOREIGN PATENT DOCUMENTS

| | | |
|---|---|---|
| JP | 2015-527749 | 9/2015 |
| JP | 2016-187025 | 10/2016 |
| WO | 2006-118632 | 9/2006 |
| WO | 2014-031229 | 2/2014 |

* cited by examiner

HIGH ELECTRON MOBILITY TRANSISTOR WITH REVERSE ARRANGEMENT OF CHANNEL LAYER AND BARRIER LAYER

CROSS REFERENCE TO RELATED APPLICATIONS

This application is a continuation of U.S. application Ser. No. 16/993,935 filed on Aug. 14, 2020, which is a continuation of U.S. application Ser. No. 16/393,689 filed on Apr. 24, 2019 (U.S. Pat. No. 10,790,385) and claims the priority benefit of U.S. application Ser. Nos. 16/993,935 and 16/393,689. The present application also is based on and claims benefit of priority of Japanese Patent Application Nos. 2018-084397, filed on Apr. 25, 2018 and 2018-084398, filed on Apr. 25, 2018, the entire contents of which are incorporated herein by reference.

BACKGROUND OF INVENTION

1. Field of Invention

The present invention relates to a high electron mobility transistor (HEMT), in particular, a HEMT primarily made of nitride semiconductor materials.

2. Related Background Arts

A Japanese patent laid open No. JP2014-524661 has disclosed an electron device that includes a substrate and a semiconductor stack provided on the substrate, where the semiconductor stack includes, from a side of the substrate, a buffer layer containing aluminum (Al), a barrier layer also containing Al, and a channel layer made of gallium nitride (GaN). The barrier layer and the GaN channel layer induce a two dimensional electron gas (2DEG) in an interface therebetween, exactly, in the GaN channel layer adjacent to the interface against the barrier layer. Another Japanese Patent Application laid open No. JP2012-074705A has disclosed a semiconductor device made of nitride semiconductor materials. The device disclosed therein includes an aluminum gallium nitride (AlGaN) layer provided on a heat spreader, a GaN layer provided on the AlGaN layer and a Schottky electrode provided on the GaN layer. The heat spreader, which is made of electrically conductive material, forms non-rectifying contact against the AlGaN layer. The AlGaN layer and the GaN layer may induce the 2DEG in the interface therebetween.

Electron devices made of nitride semiconductor materials have been developed and practically used in various fields because of a characteristic of wide bandgap energy inherent to the nitride semiconductor materials. In particular, a HEMT made of such nitride semiconductor materials basically show an extremely higher breakdown voltage compared with conventional devices made of silicon and/or semiconductor materials except for the nitride semiconductor materials. Such a HEMT of the nitride semiconductor materials include a GaN channel layer provided on a substrate, a barrier layer made of, for instance, AlGaN on the GaN channel layer, and electrodes of a gate, a source, and a drain each provided on the AlGaN barrier layer. The GaN channel layer and the AlGaN barrier layer may induce the 2DEG at the interface therebetween.

Another type of HEMTs has been developed, which provides the GaN channel on the AlGaN barrier layer to induce the 2DEG in a side opposite to the barrier layer, which has been called as a reverse HEMT. The reverse HEMT may secure conducting paths for electrons between the non-rectifying electrodes and the 2DEG without passing the barrier layer; accordingly, the reverse HEMT may reduce access resistance from the non-rectifying contacts to the 2DEG. Also, a thick buffer layer is often provided under the barrier layer, namely, between the barrier layer and the substrate, which may reduce leak currents between the non-rectifying contacts and improve, what is called, the pinch-off performance of the HEMT. In order to form a reverse HEMT, a substrate, or a buffer layer made of nitride semiconductor material show a surface of group V semiconductor materials, namely, nitrogen (N).

However, a reverse HEMT often shows a trade-off relation between the gate leak current and the access resistance. That is, a reverse HEMT forms electrodes of the gate, the source, and the drain directly on the channel layer without interposing the barrier layer, which may reduce not only the access resistance but the contact resistance of the non-rectifying electrodes, but, the gate electrode in direct contact with the channel layer without interposing the barrier layer may increase the gate leak current.

An additional layer with relatively greater bandgap energy may be provided on the channel layer, where the additional layer may behave as a barrier layer to reduce the gate leak current, but the access resistance to the 2DEG and the contact resistance of the non-rectifying electrodes increases. Removing the additional layer in regions where the non-rectifying electrodes are to be formed therein, and further additional layers heavily or highly doped are re-grown therein to reduce the contact resistance and the access resistance of the non-rectifying electrodes. However, the re-growing process inevitably makes the process of forming an electrode device complex.

SUMMARY OF INVENTION

An aspect of the present invention relates to a high electron mobility transistor (HEMT) made of primarily nitride semiconductor materials and having a reverse arrangement between a barrier layer and a channel layer. The HEMT of the present invention includes a substrate, a barrier layer, a channel layer, an intermediate layer, and electrodes of a source, a drain and a gate. The barrier layer, which is provided on the substrate, is made of nitride semiconductor material and has an N-polar surface in a side opposite to the substrate. The channel layer, which is provided on the barrier layer, is made of nitride semiconductor material, has the N-polar surface in a side opposite to the barrier layer and bandgap energy smaller than bandgap energy of the barrier layer. The intermediate semiconductor layer, which is provided on the channel layer, is made of nitride semiconductor material and has an N-polar surface in a side opposite to the channel layer. The intermediate semiconductor layer is doped with impurities by a concentration greater than a concentration of impurities in the channel layer. The source electrode and the drain electrode are provided on the intermediate semiconductor layer. The gate electrode is provided between the source electrode and the drain electrode. A feature of the HEMT of the present invention is that the intermediate semiconductor layer extends from portions beneath the source electrode and the drain electrode to a portion beneath the gate electrode.

BRIEF DESCRIPTION OF DRAWINGS

The present disclosure may be better understood, and its numerous objects and advantages made apparent to those skilled in the art by referencing the accompanying drawings.

DESCRIPTION OF EMBODIMENTS

Next, some embodiments according to the present invention will be described referring to drawings. The present invention, however, is not restricted to those embodiments and has a scope defined in claims attached hereto and all changes and modifications done within the claimed elements and equivalents thereof. In description of the drawings, numerals and/or symbols same with and/or similar to each other will refer to elements same with and/or similar to each other without duplicating explanations.

Figure 1:
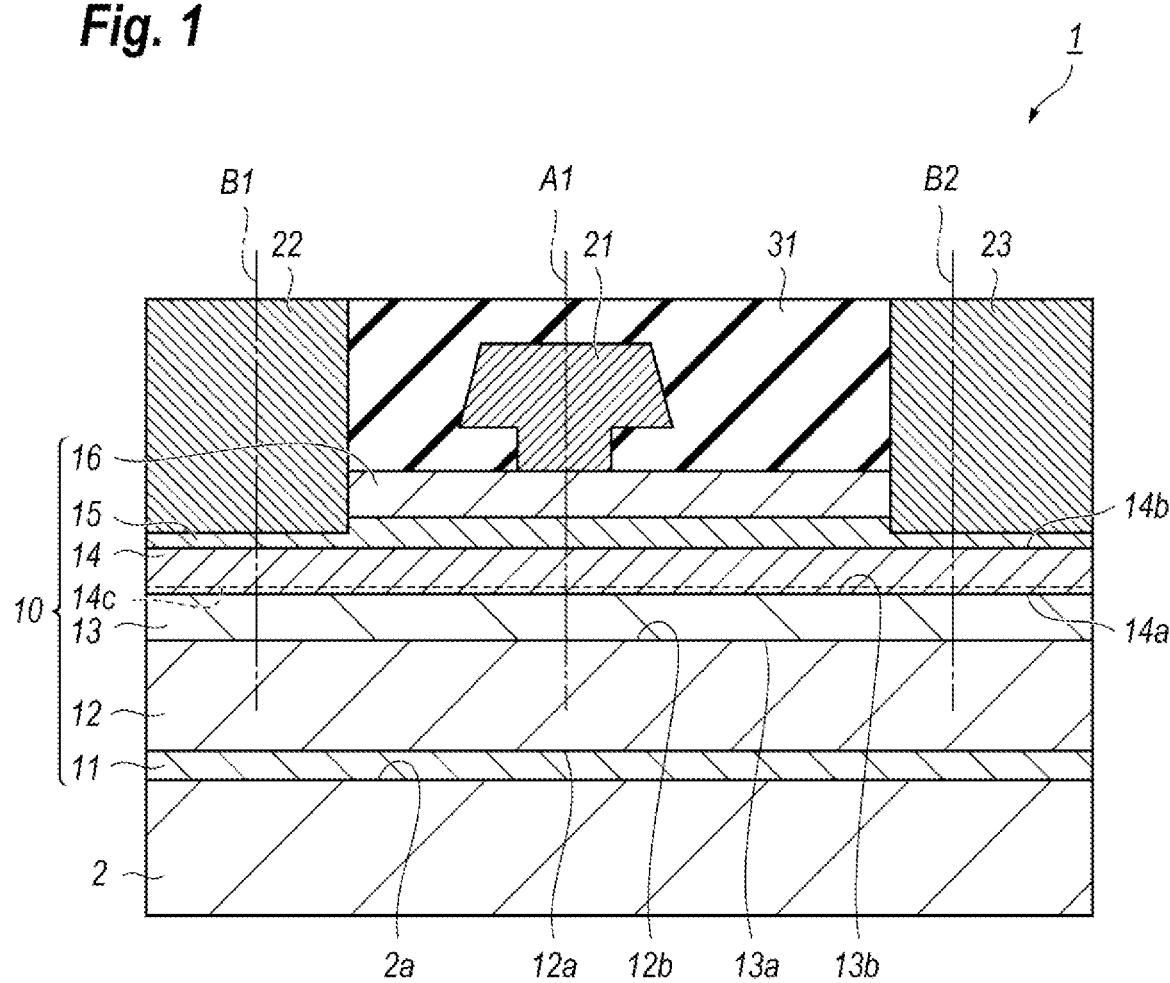
FIG. 1 is a cross sectional view of a high electron mobility transistor (HEMT) according to an embodiment of the present invention.

FIG. 1 is a cross sectional view of a high electron mobility transistor (HEMT) according to an embodiment of the present invention. The HEMT 1 shown in FIG. 1 is a type of, what is called, reverse HEMT including a substrate 2, a semiconductor stack 10 on the substrate 2, electrodes of a gate, a source, and a drain, 21 to 23, respectively, and a passivation film 31. A feature of a reverse HEMT is that the semiconductor stack 10 includes, from a side of the substrate 2, a nucleus forming layer 11 of aluminum nitride (AlN), a buffer layer 12 of gallium nitride (GaN), a barrier layer 13, a channel layer 14, an intermediate layer 15, and a Schottky barrier layer 16. That is, a reverse HEMT has an arrangement where the barrier layer 13 and the channel 14 are disposed inversely, upside down, on the substrate 1. Because of reduced access resistance from the electrodes of the source and the drain, 22 and 23, to a channel induced between the barrier layer 13 and the channel layer 14, such a reverse HEMT may be used in an E-band and/or a W-band in frequency ranges.

The substrate 2, which is prepared for epitaxially growing semiconductor layers thereon, is made of silicon carbide (SiC) with semi-insulating characteristic. A feature of the substrate 2 of the present embodiment is that the substrate 2 in atop surface 2a thereof dominantly shows carbon (C) atoms, which is often called as the C-polar surface. When the SiC substrate has the C-polar surface, nitride semiconductor layers epitaxially grown thereon exposes surfaces thereof dominantly having nitrogen (N), which are generally called as an N-polar surface. In an alternative, a process of growing semiconductor layers with the N-polar surfaces is not restricted to use the SiC substrate with the C-polar surface. Specifically, growing the semiconductor stack on a temporal substrate except for the SiC substrate 2, detaching the semiconductor stack from the temporal substrate, finally, bonding the detached semiconductor stack with a substrate, the semiconductor stack with the N-polar surface on a top thereof may be obtained on the substrate except for the SiC substrate 2. In such a process, various semi-insulating substrates may be used, for instance, a substrate made of Si, SiC, AlN, and/or sintered material may be applicable to the process.

The AlN nucleus forming layer 11 may operate as a seed layer for epitaxially growing the GaN buffer layer 12. The AlN nucleus forming layer 11 has a thickness of 5 to 50 nm, where the present embodiment has the AlN nucleus forming layer 11 with a thickness of 20 nm. A GaN buffer layer is hard, or substantially impossible, to be epitaxially grown directly on the SiC substrate 2 because of wettability of GaN against SiC. Therefore, a GaN layer is usually grown on the SiC substrate 2 interposing the AlN nucleus forming layer 11. When the substrate 2 is not prepared for the epitaxial growth, that is, the process may take steps of changing the substrate 2 described above, the AlN nucleus forming layer 11 may be omitted.

The GaN buffer layer 12 of the present embodiment is epitaxially grown on the AlN nucleus forming layer 11 as showing the N-polar surface, which means that the back surface of the GaN buffer layer 12 facing to and in contact with the AlN nucleus forming layer dominantly shows gallium (Ga), which may be often called as the Ga-polar surface; while the top surface 12b opposite to the AlN nucleus forming layer 11 becomes the N-polar surface. The GaN buffer layer 12 may have a thickness of 300 to 1000 nm, where the present embodiment has a thickness of 500 nm. When the substrate 2 is not the one prepared for the epitaxial growth, that is, the substrate 2 attaches the semiconductor stack 10 thereto, the GaN buffer layer 12 may be omitted.

The barrier layer 13, which is epitaxially grown on the top surface 12a of the GaN buffer layer 12, operates as a carrier supplying layer. The barrier layer 13 may be made of indium aluminum nitride (InAlN), aluminum gallium nitride (AlGaN), and/or indium aluminum gallium nitride (InAlGaN). The barrier layer 13 has bandgap energy that is greater than bandgap energy of the channel layer 14. The barrier layer 13 also provides a back surface 13a and a top surface 13b, where the back surface 13a, which faces and is attached to the top surface 12b of the GaN buffer layer 12, has the Ga-polarity; while the top surface 13b opposite to the back surface 13a shows the N-polarity. The barrier layer 13 of the present embodiment has a thickness of 20 to 40 nm, where the embodiment has a thickness of 30 nm. When the barrier layer 13 is $Al_YGa_{1-Y}N$ layer, the composition Y is preferably in a range of 0.15 to 0.35, the embodiment has the composition of 0.25. The barrier layer 13 may have an n-type conduction doped with n-type impurities, or an intrinsic type intentionally doping no impurities.

The channel layer 14 is epitaxially grown of the barrier layer 13 and in contact with the barrier layer 13. In an alternative, the channel layer 14 may be indirectly in contact with the barrier layer 13 interposing a spacer layer therebetween. The channel layer 14, which may be made of GaN, has the bandgap energy smaller than that of the barrier layer 13, or exactly, the barrier layer 13 has the electron affinity smaller than that of the channel layer 14 to cause a hetero-interface therebetween. The channel layer 14 also provides a back surface 14a and a top surface 14b, where the back surface 14a, which faces to and is in contact with the top surface 13b of the barrier layer 13, shows the Ga polarity, and the top surface 14a opposite to the back surface 14b shows the N-polarity. The channel layer 14 may have a thickness of 10 to 14 nm, where the embodiment has a thickness of 12 nm, which is far thinner than a channel layer of a normal (not reverse) HEMT. The GaN channel layer 14 and the barrier layer made of materials different from GaN causes stresses in the interface therebetween due to lattice-constants different from each other; and induce piezo charges that are accumulated at the interface to cause a two-dimensional electron gas (2DEG), which forms a channel 14c of the HEMT 1. Exactly, the 2DEG may be formed in the channel layer 14 at the interface against the barrier layer 13. The GaN channel layer 14 shows the n-type conduction slightly doped with n-type impurities, or the i-type intentionally doped with no impurities.

The intermediate layer 15, which is epitaxially growing on the channel layer 14, has an impurity concentration is greater than that of the channel layer 14. The intermediate layer 15 may have a semiconductor material with a composition same with that of the channel layer 14, where the intermediate layer 15 may be grown continuous to growth of the channel layer 14 but supplying doping materials thereafter. The intermediate layer 15 extends from portions beneath the source and drain electrodes, 22 and 23, to a portion beneath the gate electrode 21. The intermediate layer 15 covers the whole of the channel layer 14 and has a thickness of 5 to 15 nm, where the embodiment has the thickness of 11 nm. That is, the intermediate layer 15 is interposed between the non-rectifying electrodes of the source and the drain, 22 and 23, and the channel layer 14 beneath the electrodes, 22 and 23. The intermediate layer 15 may be dopes with silicon (Si) as n-type dopants by density greater than $1.0 \times 10^{17}$ cm$^{-3}$, preferably $1.0 \times 10^{18}$ cm$^{-3}$. The present embodiment has the doping density in the intermediate layer 15 of $2.0 \times 10^{18}$ cm$^{-3}$. The doping concentration in the intermediate layer 15 in an upper limit thereof is $1.0 \times 10^{20}$ cm$^{-3}$ for the dopant of Si, while, $1.0 \times 10^{19}$ cm$^{-3}$ for the dopant of germanium (Ge).

In a modification, the intermediate layer 15 may be made of indium aluminum gallium nitride In$_x$Al$_y$Ga$_{1-x-y}$N, where compositions, x and y, for indium (In) and aluminum (Al), are 0<x<1 and 0<=y<1, respectively, where the modification provides the In composition of x=0.03, or preferably x>0.05, while, the Al composition of y=0, that is, the intermediate layer 15 of the modification is In$_x$Ga$_{1-x}$N (0<x<1).

The Schottky barrier layer 16, which is editorially grown on the intermediate layer 15, may be made of AlGaN and have bandgap energy greater than that of the channel layer 14 and that of the intermediate layer 15. The Schottky barrier layer 16 may have a thickness less than 5 nm but 1.5 nm at least. When the Schottky barrier layer 16 is made of Al$_y$Ga$_{1-y}$N, the Al composition thereof x may be 0.15 to 0.35, where the embodiment has the Al composition of 0.25. The Schottky barrier layer 16 may have the n-type conduction, or the i-type that is intentionally doped with no impurities. The Schottky barrier layer 16 in portions beneath the electrodes of the source 22 and the drain 23 are removed, which means that the Schotkky barrier layer 16 has openings in the portions for the electrodes of the source 21 and the drain 22.

The source electrode 22 and the drain electrode 23, which are arranged side by side on the substrate 1 forming a span of, for instance, 3.0 µm, are in contact with the intermediate layer 15 to form non-rectifying contact thereto burying the openings in the Schottky barrier layer 16, which are described above. The electrodes of the source 21 and the drain 22 may be formed by alloying stacked metals of titanium (Ti) and aluminum (Al).

The gate electrode 21, which is disposed between the electrodes of the source 22 and the drain 23, where the present embodiment disposes the gate electrode 21 in direct contact with the Schottky barrier layer 16. The gate electrode 21 may be stacked metals of nickel (Ni) and gold (Au), where Ni is in contact with the Schottky barrier layer 16 to form a Schottky contact thereto. The present embodiment has the gate electrode 21 with a cross section of a T-character, where a width of a vertical bar of the T-character, which is the gate length, of 0.3 µm.

The passivation film 31, which is provided on the Schottky barrier layer 16, covers the gate electrode 21 and the intermediate layer 15 to protect the semiconductor stack chemically and physically. The passivation film 31 may be made of inorganic material containing silicon (Si), typically, silicon nitride (SiN), silicon oxide (SiO$_2$), and/or silicon oxy-nitride (SiON).

Next, a process of forming the HEMT 1 according to an embodiment of the present invention will be described. First, the metal organic chemical vapor deposition (MOCVD) technique epitaxially grows the AlN nucleus forming layer 11 on the substrate 2. When the substrate 2 is SiC, the surface 2a thereof has the C-polar surface, namely, dominantly exposing carbon [C] atoms. The MOCVD technique sets source gases of tri-methyl-aluminum (TMA) and ammonia (NH$_3$) for sources of Al and N, respectively, and a growth temperature of 1100° C. Then, the MOCVD technique continuously and sequentially grows the GaN buffer layer 12 subsequent to the nucleus forming layer 11 using sources of tri-methyl-gallium (TMG) and NH$_3$ for Ga and N, respectively, at the growth temperature of 1050° C.

Thereafter, the barrier layer 13 is epitaxially grown on the GaN buffer layer 12. When the barrier layer 13 is made of AlGaN, the sources of TMA, TMG and NH$_3$ are used. Thereafter, the channel layer 14 is epitaxially grown on the barrier layer 13 using TMG and NH$_3$ as the sources for Ga and N, respectively, where the channel layer 14 is made of GaN, at the growth temperature of 1050° C. Thereafter, the intermediate layer 15 is epitaxially grown on the channel layer 14. When the intermediate layer 15 is InGaN containing no Al, the MOCVD technique sets the sources of TMI, TMG, and NH$_3$, and the growth temperature of 800° C.; while, the intermediate layer 15 contains Al, namely, InAlGaN, the MOCVD technique further sets the source of TMA for Al and the growth temperature of also 800° C. The MOCVD technique for the intermediate layer 15 adds a gist of mono-shilane (SiH$_4$) as a source of the n-type dopant (Si). When the intermediate layer 15 has the composition same with the channel layer, only the source gas of the n-type dopants after the completion of the growth of the channel layer 14. While, the intermediate layer 15 has the composition different from that of the channel layer 14, the MOCVD technique re-arranges the source gases and adds the dopant gas. Subsequently, the MOCVD technique epitaxially grows the Schotkky barrier layer 16. When the Schottky barrier layer 16 is AlGaN, the MOCVD technique uses the sources of TMA, TMG, and NH$_3$, and sets the growth temperature of 1050° C.

Thereafter, the electrodes of the source 22 and the drain 23 are formed on the grown semiconductor layer. First, removing the Schotkky barrier layer 16 to from recesses in portions where the electrodes of the source 22 and the drain 23 are to be formed, the stacked metals for the electrodes, 22 and 23, are deposited. Reactive ion etching (RIE) may remove the Schottky barrier layer 16 and partially remove the intermediate layer 15 using a reactive gas containing chlorine (Cl) to expose left portions of the intermediate layer 15.

The stacked metals for the source and drain electrodes, 22 and 23, are deposited by vacuum evaporation so as to be in contact with the exposed intermediate layer 15. Alloying the stacked metals carried out subsequent to the metal deposition, the non-rectifying electrodes of the source 22 and the drain 23 are formed on the intermediate layer 15. Thereafter, the gate electrode 21 is formed between the electrodes of the source 22 and the drain 23 so as to be in direct contact with the Schottky barrier layer 16. Thus, the process of forming the HEMT 1 is completed.

Figure 2:
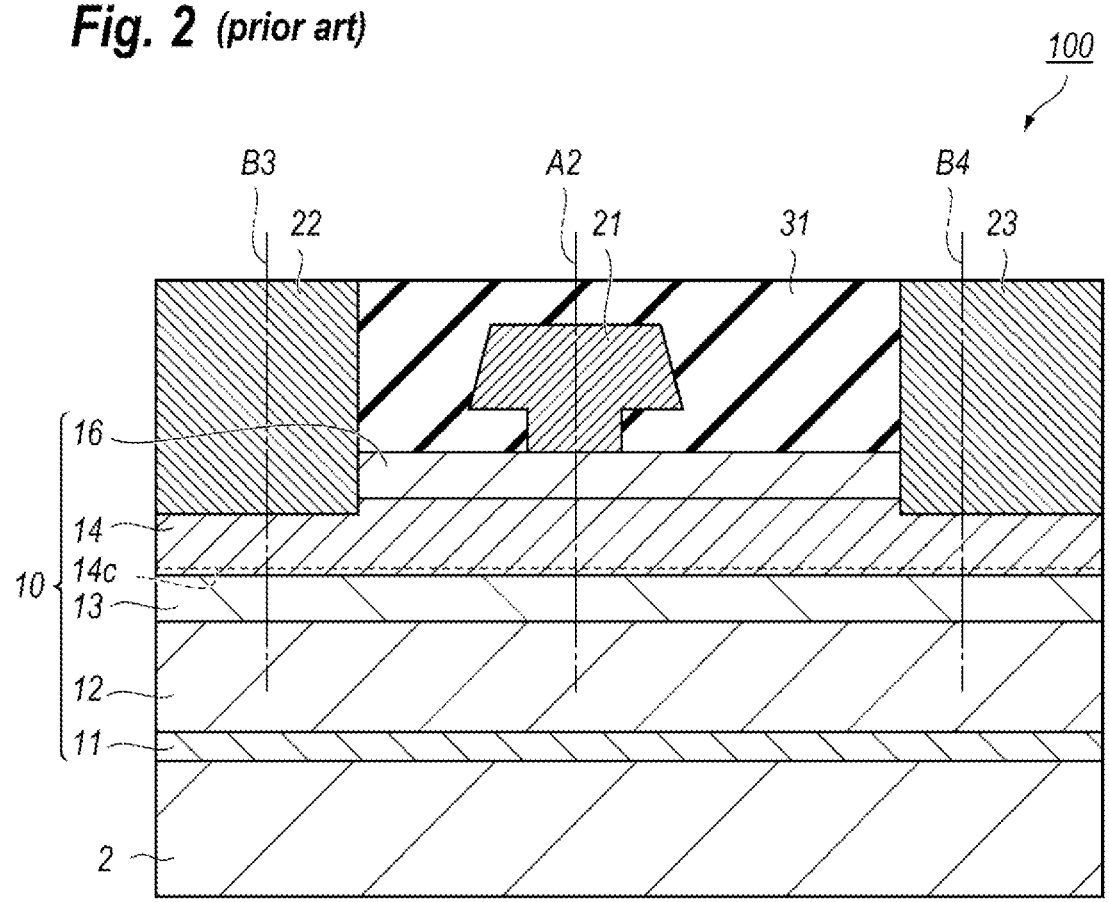
FIG. 2 is a cross sectional view of a HEMT with providing no intermediate layer.

Next, some advantages according to the HEMT 1 of the present embodiment will be described comparing with a conventional HEMT, in particular, comparing with subjects inherently attributed to a conventional HEMT. FIG. 2 is a cross sectional view of a conventional HEMT 100, where two on-rectifying electrodes of the source 22 and the drain 23 are in direct contact with the channel layer 14. Other arrangements of the HEMT are substantially comparable with those of the HEMT 1 of the present embodiment.

Figure 3A:
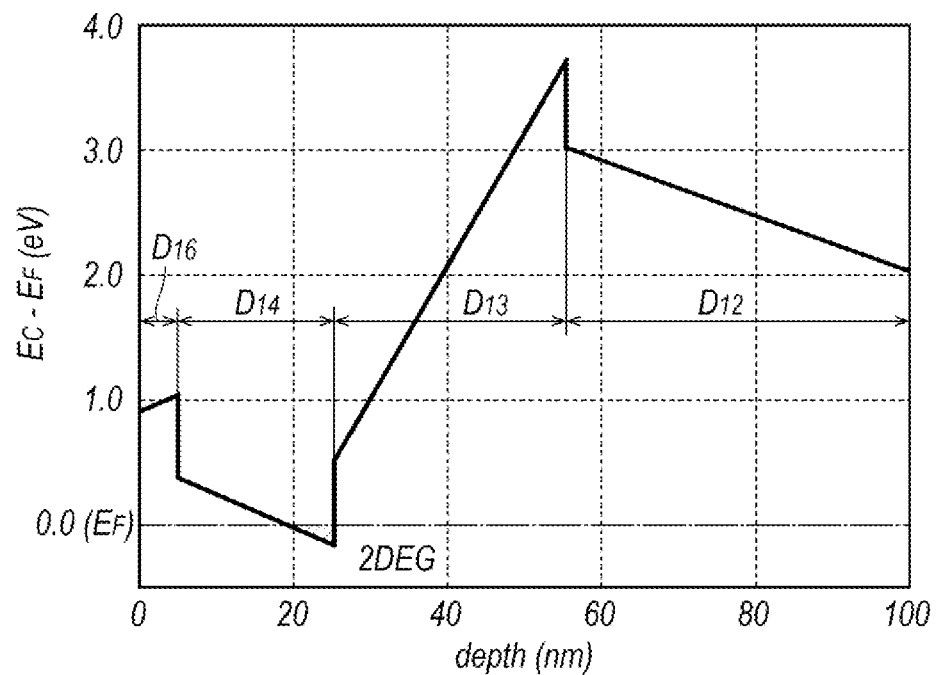
FIG. 3A and FIG. 3B show band diagrams of the HEMT shown in FIG. 2.
Figure 3B:
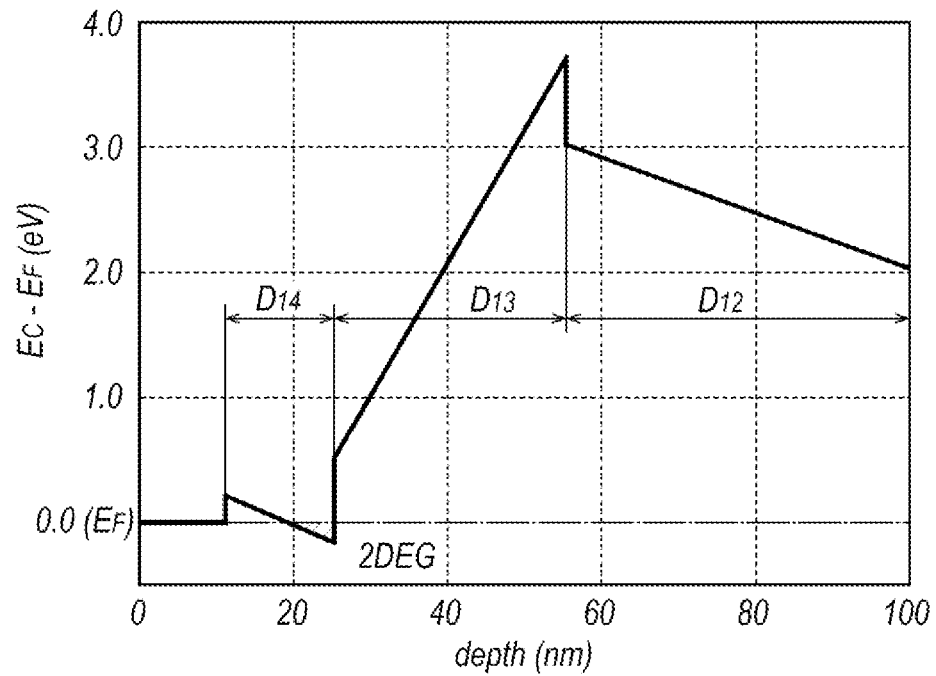

FIG. 3A and FIG. 3B explain an energy profile of the bottom of the conduction band measured from the Fermi level in the conventional HEMT 100, where FIG. 3A indicates the energy profile along the line A2 indicated in FIG. 2, namely, around the gate electrode 21; while, FIG. 3B shows the energy profile along the lines, B3 and B4, namely, around the source electrode 22 and the drain electrode 23, respectively. In FIG. 3A and FIG. 3B, the horizontal axis corresponds to a depth measured from a surface of the semiconductor stack 10 in the unit of nano-meter, while, the vertical axis denotes the energy level of the bottom of the conduction band measured from the Fermi level. Symbols, D12 to D16, correspond to the GaN buffer layer 12, the barrier layer 13, the channel layer 14, and the Schottky barrier layer 16. The energy level of 0 eV corresponds to the Fermi level, where the 2DEG is formed in regions below the Fermi level, that is, in the region D14 of the channel layer 14 at the interface against the barrier layer 13.

Referring to FIG. 3A, the conventional HEMT 100 raises the band diagram around the gate electrode 21, exactly, a region with a depth less than 5 nm from the gate electrode 21, due to the piezo charges induced between the AlGaN Schottky barrier layer 16 and the GaN channel layer 14. The raise of the band becomes a barrier for the carrier transportation and may reduce the gate leak current. While, referring to FIG. 3B, although the HEMT 100 removes the Schotkky barrier layer 16, the HEMT 100 slightly raises the band, which becomes a barrier for the carrier transportation, in regions where the ohmic electrodes of the source 22 and the drain 23 are in contact with the GaN channel layer 14 because the 2DEG locates below the Fermi level.

Figure 4A:
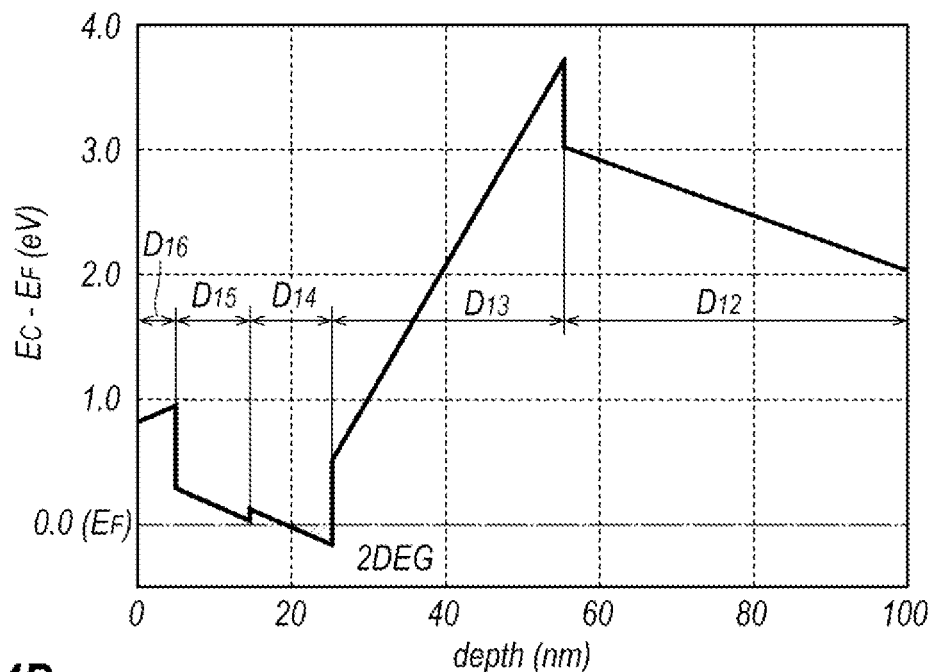
FIG. 4A and FIG. 4B show band diagrams of the HEMT shown in FIG. 1.
Figure 4B:
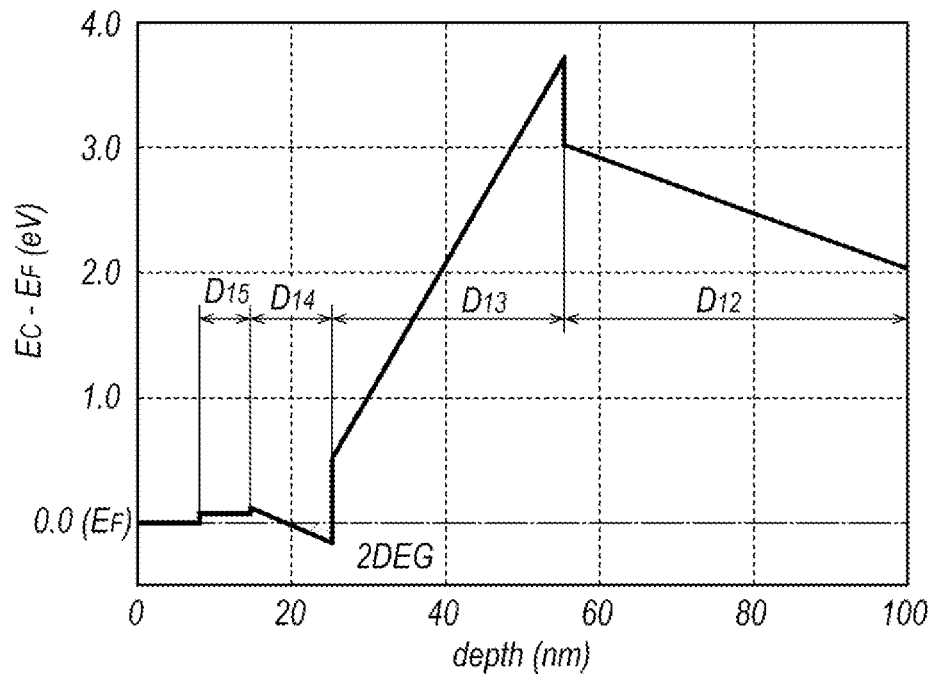

FIG. 4A and FIG. 4B show energy profiles between the conductional band and the Fermi level in the HEMT 1 according to the present embodiment of the invention, where FIG. 4A shows the enemy profile along the line A1 including the gate electrode 21, while, FIG. 4B shows the energy profile along the lines, B1 and B2, including the source electrode 22 and the drain electrode 23, respectively. The horizontal axis corresponds to a depth measured from the surface of the semiconductor stack, while, the vertical axis shows the energy level of the bottom of the conduction band measured from the Fermi level $E_F$ in the unit of electron volts (eV). Symbols, D12 to D16, in the figures correspond to existing ranges of the GaN buffer layer 12, the barrier layer 13, the channel layer 14, the doped semiconductor layer 15, and the Schottky barrier layer 16.

Referring to FIG. 4A, the HEMT 1 of the present embodiment also raises the energy band due to the piezo charges induced by a stress caused between the AlGaN Schottky barrier layer 16 and the intermediate semiconductor layer ($n^+$ GaN) 15, which raises a barrier height of the gate electrode to reduce the gate leak current. The band becomes slightly lowers by the impurities in the intermediate layer 15. However, this lowering causes smaller influence compared with the raise due to the piezo charges between the intermediate layer 15 and the Schottky barrier layer 16. Also, the Schottky barrier layer 16 may raise the barrier height of the gate electrode 16 and reduce the gate leak current. The gate leak current was measured to be 0.01 µA/mm ($1\times10^{-6}$ A/mm) by supplying a reverse bias of 50 V between the gate electrode 21 and the drain electrode 23, which was comparable to those measured in the conventional HEMT 100. Referring to FIG. 4B, the doped semiconductor layer 15 may equivalently lower the band at the interfaces against the source electrode 22 and the drain electrode 23, which may disappear the hetero-barrier for the carrier transportation in the path from the source electrode 22 and the drain electrode 23 to the channel 14.

Figure 5:
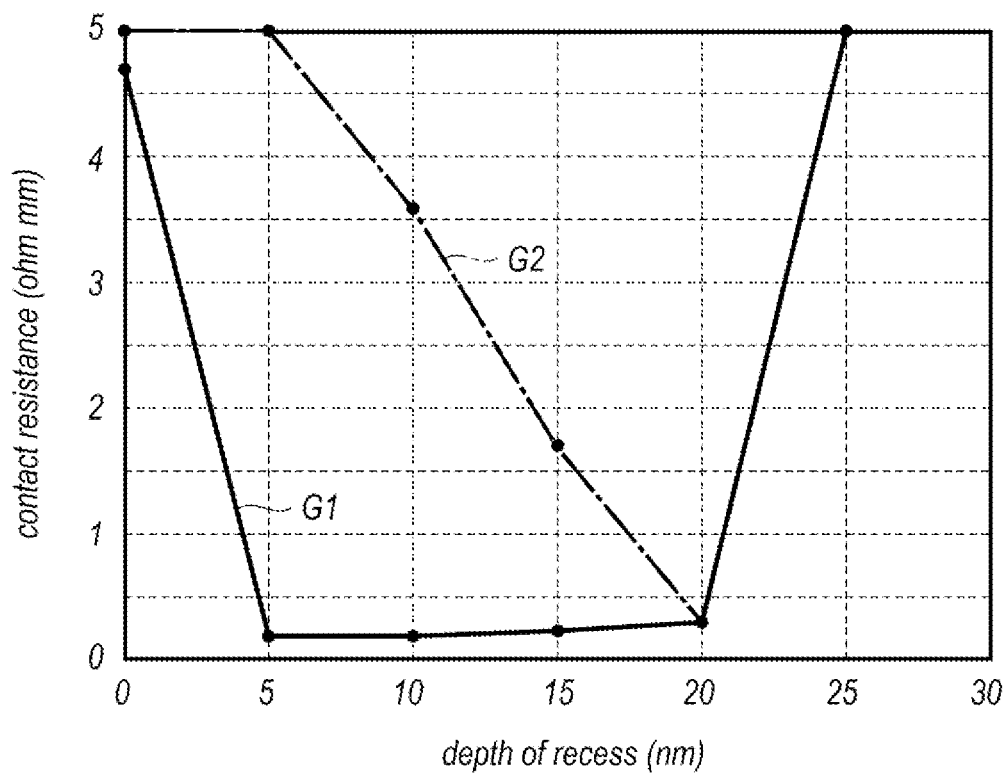
FIG. 5 shows a relation of contact resistance of non-rectifying electrodes against a depth of a recess for a Schottky barrier.

FIG. 5 shows a behavior of the resistance of the electrode, which includes the contact resistance of the non-rectifying electrodes and the access resistance from the non-rectifying electrodes to the 2DEG, against a depth formed during the etching of the Schottky barrier layer 16, which partially etches the intermediate layer 15. A behavior G1 in FIG. 5 corresponds to the resistance of the electrode of the HEMT 1 according to the present invention, while, another behavior G2 corresponds to the resistance of the conventional HEMT 100 shown in FIG. 2. The horizontal axis denotes the depth in the unit of nano-meter, while, the vertical axis denotes the resistance in the unit of Ω·mm. The Schottky barrier layer 16 has a thickness of 5 nm, and the depth of the interface between the channel layer 14 and the barrier layer 13 is set to be 25 nm. The contact resistance is measured by the transfer length method (TLM).

As shown in FIG. 5, the conventional HEMT 100 shows an acceptable resistance when the etching depth is just adjusted to the depth of the 2DEG, which is 20 nm. However, the conventional HEMT 100 shows a strict range of the etching depth, where slight variation of the etching depth results in a great increase in the resistance. On the other hand, the HEMT 1 of the present embodiment shows the resistance of 0.2 to 0.3 Ω·mm in a wide range of the etching depth, specifically, 5 to 20 nm, where the former limit corresponds to the depth of the interface between the Schottky barrier layer 16 and the intermediate semiconductor layer 15, while, the latter corresponds to the depth of the 2DEG. The resistance becomes small enough not only the magnitude but the variation thereof.

Figure 6:
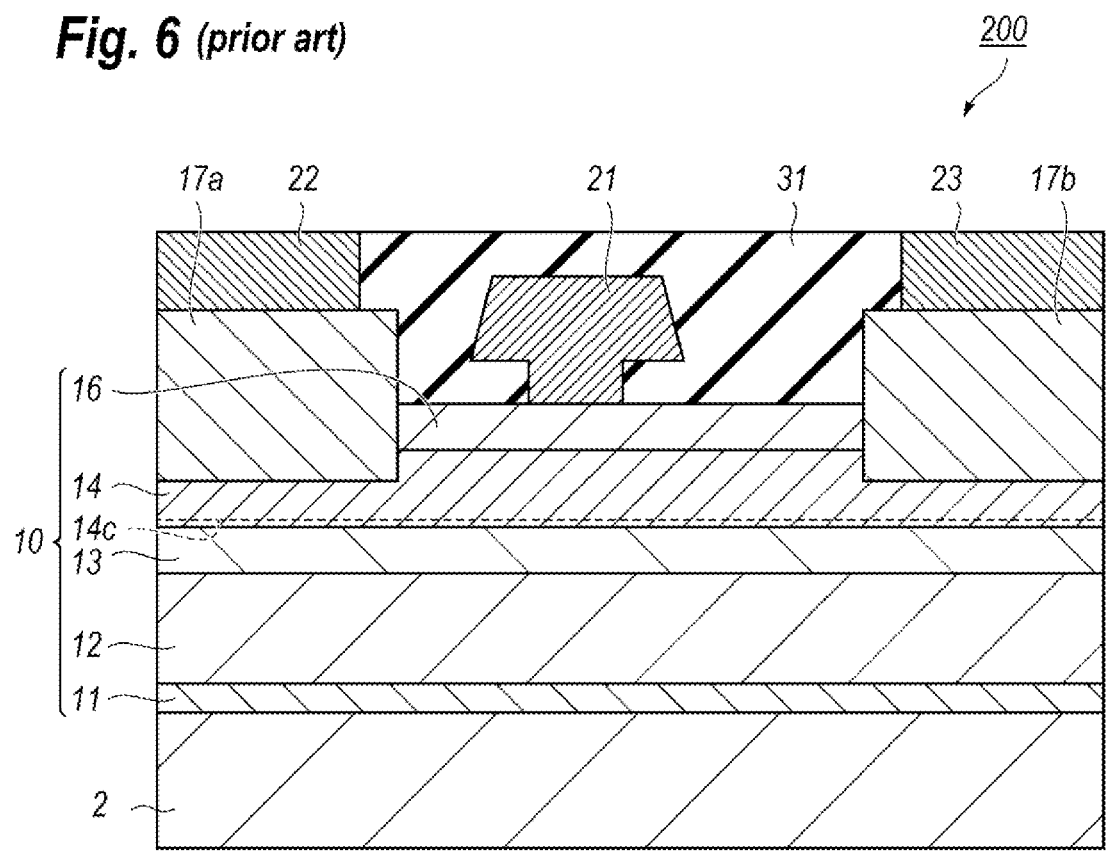
FIG. 6 is a cross sectional view of still another conventional HEMT.

FIG. 6 is a cross sectional view of another HEMT 200 that is modified from the conventional HEMT 100. The HEMT 200 further includes, from the arrangement of the HEMT 100 shown in FIG. 2, two doped layers, 17a and 17b, which are made of GaN heavily doped with silicon (Si). The doped semiconductor layers, 17a and 17b, bury the recesses formed in the Schottky barrier layer 16 and are in contact with the channel layer 14 exposed within the opening. The source electrode 22, which is provided on the doped semiconductor layer 17a, makes anon-rectifying contact against the Schottky barrier layer 16. The drain electrode 23 is provided on the other doped semiconductor layer 17b to make a non-rectifying contact against the doped semiconductor layer 17b. The doped semiconductor layers, 17a and 17b, are often called as a contact layer.

The conventional HEMT 100 shown in FIG. 2 may not reduce the contact resistance enough because the electrodes of the source 22 and the drain 23 are in contact with the GaN channel layer 14. The HEMT 200 shown in FIG. 6, on the other hand, may give a solution for the subject above. That is, the doped semiconductor layers, 17a and 17b, which are provided between the channel layer 14 and the electrodes of the source 22 and the drain 23, may effectively reduce the contact resistance.

However, the process requires to grow the doped layers, 17a and 17b, after partially removing the Schottky barrier layer 16 in order to realize the HEMT 200 shown in FIG. 6, which inevitably increases the steps of the process and reduces the yield of the HEMT 200. The HEMT 1 of the present embodiment, in particular, the process of forming the HEMT 1 becomes unnecessary to re-grow semiconductor layers, which means that the contact and access resistance of the non-rectifying electrodes without increasing the steps of forming the HEMT.

The intermediate layer 15 may have the impurity density thereof greater than $1.0 \times 10^{17}$ cm$^{-3}$, preferably greater than $1.0 \times 10^{18}$ cm$^{-3}$, which may effectively reduce the contact and access resistance of the non-rectifying electrodes. The intermediate layer 15 may have a thickness of 5 to 15 nm. The intermediate layer 15 with the thickness thereof greater than 5 nm may have an enough margin for etching the Schottky barrier layer 16; while, the intermediate layer 15 with a thickness less than 15 nm may form a depletion layer beneath the gate electrode 21 securely reaching the barrier layer 13; that is, the thinner intermediate layer 15 may enough deplete the channel, or the 2DEG formed at the interface between the channel layer 14 and the barrier layer 13.

The substrate 2 may be made of SiC, in particular, the substrate 2 in the primary surface 2a thereof may show the polar of carbons (C), which enables the nitride semiconductor layers grown thereon show the N-polar surface and realize the reverse HEMT with the channel layer 14 thereof provided on the barrier layer 13.

The HEMT 1 of the present embodiment may provide, on the primary surface 2a of the substrate 2, which shows the C-polar surface, the AlN nucleus forming layer 11, and the GaN buffer layer 12 on the AlN nucleus forming layer 11. Such double layers of the nucleus forming layer 11 and the buffer layer 12 may enhance the crystal quality of the barrier layer 13 and the channel layer 14.

The HEMT 1 of the embodiment may further provide the Schottky barrier layer 16 on the intermediate layer 15, where the Schottky barrier layer 16, to which the gate electrode 21 is provided, preferably has the bandgap energy greater than that of the intermediate layer 15, which may effectively reduce the gate leak current. The Schottky barrier layer 16, which may be an un-doped layer, preferably has a thickness thinner than 5 nm to securely deplete the channel, or the 2DEG 14c.

The HEMT according to the present invention is not restricted to the embodiments thus described, and has various changes and modifications. For instance, the barrier layer 13, the channel layer 14, and the Schottky barrier layer 16 are not restricted to the combination of AlGaN, GaN, and AlGaN, respectively. However, those layers, 13 to 16, are requested only to be made of nitride semiconductor materials, that is, to contain nitrogen (N). For instance, the channel layer 14 may be made of indium gallium nitride (InGaN), while, the barrier layer 13 and the Schottky barrier layer 16 may be made of at least one of InAlN and InAlGaN, or may be formed by stacked layers of at least two of AlGaN, InAlN, and InAlGaN. Also, the embodiments concentrate on a configuration where the gate electrode 21 is in direct contact with the Schotkky barrier layer 16; however, an insulating film may be proved between the gate electrode 21 and the Schottky barrier layer 16; that is, a device according to the present invention may have a arrangement of a metal-insulator-semiconductor (MIS) device.

What is claimed is:

1. A high electron mobility transistor (HEMT), comprising
    a substrate;
    a barrier layer provided on the substrate, the barrier layer being made of nitride semiconductor material and having an N-polar surface at a side opposite to the substrate;
    a channel layer provided on the barrier layer, the channel layer being made of nitride semiconductor material and having a bandgap energy smaller than a bandgap energy of the barrier layer and an N-polar surface at a side opposite to the barrier layer;
    an intermediate semiconductor layer provided on the channel layer, the intermediate semiconductor layer being made of nitride semiconductor material and having an N-polar surface at a side opposite to the channel layer;
    a source electrode and a drain electrode provided on the intermediate semiconductor layer,
    a gate electrode provided between the source electrode and the drain electrode; and
    a Schottky barrier layer provided on the intermediate layer, the Schottky barrier layer having a bandgap energy greater than a bandgap energy of the intermediate layer,
    wherein the intermediate semiconductor layer extends from portions thereof beneath the source electrode and the drain electrode to a portion thereof beneath the gate electrode,
    wherein a first conduction band's energy level of the intermediate semiconductor layer at an interface between the intermediate semiconductor layer and the source electrode or the drain electrode, is lower than a second conduction band's energy level of the intermediate semiconductor layer at an interface between the intermediate semiconductor layer and the Schottky barrier layer.

2. The HEMT according to claim 1, wherein a thickness of portions under the source electrode and the drain electrode in the channel layer is smaller than a thickness of a portion under the gate electrode.

3. The HEMT according to claim 1, wherein the substrate is made of silicon carbide (SiC).

4. The HEMT according to claim 3, wherein the substrate has a C-polar surface and the barrier layer is provided on the C-polar surface of the substrate.

5. The HEMT according to claim 1, wherein the barrier layer is made of at least one of aluminum gallium nitride (AlGaN), indium aluminum nitride (InAlN), and indium aluminum gallium nitride (InAlGaN).

6. The HEMT according to claim 5, further having a buffer layer made of gallium nitride (GaN) located between the substrate and the barrier layer.

7. The HEMT according to claim 5, wherein the barrier layer has a thickness of 20 to 40 nm.

8. The HEMT according to claim 1, wherein the channel layer is made of gallium nitride (GaN).

9. The HEMT according to claim 1, wherein the channel layer has a thickness of 5 to 15 nm.

10. The HEMT according to claim 1, wherein the layer has a bandgap energy greater than the bandgap energy of the channel layer.

11. The HEMT according to claim 1, wherein the intermediate layer is made of a same material as the channel layer.

12. The HEMT according to claim 1, wherein the intermediate layer is made of nitride semiconductor material.

13. The HEMT according to claim 12, wherein the nitride semiconductor material contains indium (In).

14. The HEMT according to claim 1,
wherein the Schottky barrier layer is undoped and has a thickness thinner than 5 nm.

15. The HEMT according to claim 1,
wherein the Schottky barrier layer is removed beneath the source electrode and the drain electrode, and
wherein the source electrode and the drain electrode are in direct contact with the intermediate layer.

16. The HEMT according to claim 15,
wherein the intermediate layer in portions beneath the source electrode and the drain electrode is partially removed.

* * * * *